United States Patent [19]

Nishida

[11] Patent Number: 5,269,852
[45] Date of Patent: Dec. 14, 1993

[54] CRYSTALLINE SOLAR CELL AND METHOD FOR PRODUCING THE SAME

[75] Inventor: Shoji Nishida, Fujisawa, Japan

[73] Assignee: Canon Kabushiki Kaisha, Tokyo, Japan

[21] Appl. No.: 887,821

[22] Filed: May 26, 1992

[30] Foreign Application Priority Data

May 27, 1991 [JP] Japan .................................. 3-149319

[51] Int. Cl.$^5$ .............. H01L 31/0368; H01L 31/0392; H01L 31/06; H01L 31/18
[52] U.S. Cl. .......................................... 136/258; 437/4
[58] Field of Search ....................... 136/258 PC; 437/4

[56] References Cited

U.S. PATENT DOCUMENTS

| | | | |
|---|---|---|---|
| 5,087,296 | 2/1992 | Kondo et al. ................. | 136/258 PC |
| 5,094,697 | 3/1992 | Takabayashi et al. ......... | 136/249 TJ |
| 5,098,850 | 3/1992 | Nishida et al. ............... | 437/4 |
| 5,103,851 | 4/1992 | Nishida et al. ................ | 136/249 TJ |

FOREIGN PATENT DOCUMENTS

| | | | |
|---|---|---|---|
| 63-182872 | 7/1988 | Japan .............................. | 136/258 PC |
| 1-51671 | 2/1989 | Japan .............................. | 136/258 PC |
| 1-149483 | 6/1989 | Japan .............................. | 136/258 PC |

OTHER PUBLICATIONS

"Grain Grown Mechanism of Heavily Phosphorous-Implanted Polycrystalline Silicon" by Yasuo Wada et al., Journal of the Electrochemical Society, vol. 125, No. 9 Sep. 1978, pp. 1499-1504.

Primary Examiner—Aaron Weisstuch
Attorney, Agent, or Firm—Fitzpatrick, Cella, Harper & Scinto

[57] ABSTRACT

A crystalline solar cell is formed by growing single crystals on respective plural nucleation areas provided on a non-nucleation surface in such a manner that the neighboring single crystals do not have a crystal grain boundary therebetween. The solar cell comprises an insulation layer having an aperture formed on each of said single crystals. A semiconductor junction is formed at each single crystal at the respective aperture.

19 Claims, 6 Drawing Sheets

CRYSTALLINE SOLAR CELL AND METHOD FOR PRODUCING THE SAME

BACKGROUND OF THE INVENTION

1. Field of the Invention

The present invention relates to a solar cell adapted for use as an electric voltage source and an electric power source for various electronic appliances and driving equipment, and a method for producing the same, and more particularly to a solar cell capable of providing a high open-circuit voltage with a small amount of materials by growing single crystals without grain interfaces on small nucleation surfaces formed on a non-nucleation surface, and a method for producing the same.

2. Related Background Art

The solar cell employs, in the functional part thereof, a PN junction of which the semiconductor components are generally composed of silicon. Though monocrystalline silicon is preferred in terms of the efficiency for converting the optical energy into the electromotive force, amorphous silicon is considered advantageous in terms of formation of a large-area device and cost reduction.

In recent years there has been investigated the use of polycrystalline silicon with the conceived advantages of a low cost comparable to that of amorphous silicon and a high energy conversion efficiency comparable to that of monocrystalline silicon. However, in the conventionally proposed methods utilizing a plate-like member sliced from a block of polycrystals, it is difficult to reduce the thickness below 0.3 mm. The thickness is therefore in excess of the value required for sufficient light absorption, and the effective utilization of material is not attained in this respect. Thus a sufficiently thin structure is indispensable for reducing the cost.

For this reason attempts have been made to form a thin polycrystalline silicon film with thin film forming methods such as chemical vapor deposition (CVD), but there have only been obtained crystal grains of the order of several hundredths of a micrometer, and the energy conversion efficiency obtainable with such crystal grains is even lower than that with the sliced block polycrystalline silicon.

Also, there has been reported the so-called "abnormal grain growing" technology, in which atoms of an impurity such as phosphorus are introduced, by ion implantation to a supersaturated state, into a thin polycrystalline silicon film formed by the above-mentioned CVD method, and said film is annealed at a high temperature to increase the crystal grain size to 10 times or more of the film thickness (Yasuo Wada and Sigeru Nishimatsu, *Journal of the Electrochemical Society*, Solid State Science and Technology, Vol. 125 (1978), pg. 1449), but such crystal grains cannot be used in the active layer for generating photocurrent, because of the excessively high impurity concentration.

It has also been attempted to melt and recrystallize a thin polycrystalline silicon film with laser beam irradiation, thereby increasing the crystal grain size, but the cost reduction is insufficient and stable manufacture is also difficult.

Such situation is not limited to silicon but also commonly exists for compound semiconductors.

On the other hand, a method disclosed in the Japanese Patent Laid-Open Application No. 63-182872 is capable of providing a thin polycrystalline solar cell consisting of a group of single crystals having sufficiently large crystal grain sizes and a satisfactory energy conversion efficiency, by the steps of forming, on a substrate surface, a different material having a nucleation density sufficiently larger than that of the material constituting said substrate and being sufficiently small so as to allow the growth of a single nucleus, forming a nucleus on said different material by deposition, and growing a crystal from said nucleus, thereby forming a monocrystalline semiconductor layer of a first conductivity type on said substrate surface, and then forming a monocrystalline semiconductor layer of a second conductivity type on the above-mentioned semiconductor layer.

However, the above-mentioned conventional method is associated with a drawback that crystal grain boundaries are formed in the positions where the single crystals, grown from small nucleation surfaces composed of said different material, come into mutual contact.

In general, in a polycrystalline semiconductor, many monocrystalline grains with different crystal orientations for many grain boundaries, and defect levels are formed in the forbidden band because atoms with free bonds are present at such grain boundaries. The characteristics of the semiconductor device are closely related to the defect density of the semiconductor layers to be produced. In the polycrystalline semiconductor device, the device characteristics are considered to be significantly affected by the grain boundaries, since such grain boundaries not only contain defect levels but also tend to induce precipitation of impurities, thus leading to deteriorated device characteristics. Stated differently, in order to improve the characteristics of a polycrystalline semiconductor device, it is effective to reduce the amount of grain boundaries present in the semiconductor layers. The above-mentioned method aims at a reduction of the amount of the grain boundaries by an increase in the crystal grain size.

FIGS. 7A and 7B are schematic cross-sectional views of solar cells produced by conventional methods. FIG. 7A illustrates a common polycrystalline semiconductor layer, in which a plurality of grain boundaries 502 are present crossing a junction plane 501. On the other hand, FIG. 7B illustrates a semiconductor consisting of a group of monocrystalline Si bodies formed by the selective crystal growing method, in which crystals are grown on small nucleation surfaces consisting of a different material. In this case, crystal grain boundaries 504 are present between the monocrystalline Si bodies 503.

The PN junction is generally formed in the vicinity of a surface of the semiconductor layer at the light incident side. In the case of a polycrystalline semiconductor, active grain boundaries 502 are included, as shown in FIGS. 7A, in the PN junction, thus generating a current by recombination. Consequently, the dark current becomes significantly higher than in the monocrystalline semiconductor, thereby giving rise to deterioration of characteristics, particularly a decrease in the open-circuit voltage. In an ordinary polycrystalline silicon solar cell, the open-circuit voltage is generally 0.5 V or lower unless a particular treatment such as hydrogen passivation is conducted. Also in the above-mentioned method, in which the second monocrystalline layer is formed as a continuation of the first monocrystalline layer, the grain boundaries are included as shown in FIG. 7B though the amount thereof is less than that in the common polycrystalline semiconductor with small grain sizes, so that the open-circuit voltage is lower than in the monocrystalline semiconductor. In this manner, in the polycrystalline silicon, the recombination current becomes predominant and increases the amount of the dark current. Consequently, if the formation of grain boundaries, giving rise to such recombination current, can be prevented, the dark current will be drastically reduced and the open-circuit voltage is expected to increase significantly.

In a polycrystalline silicon film, prepared for example by ordinary CVD, the crystal grain size fluctuates and the position of the grain boundaries cannot be defined because the nuclei are generated in a random manner. On the other hand, a method disclosed in the Japanese Patent Laid-Open Application No. 63-182872 can define the position of the grain boundaries as the locations of single crystal generation, and the fluctuation in the grain size can be controlled.

FIG. 6A is a view showing the arrangement of nucleation surfaces on a substrate in such silicon film formation; FIG. 6B is a lateral cross-sectional view along a line 6A—6A' in FIG. 6A; FIG. 6C is a view of single crystals grown on said substrate; and FIG. 6D is a cross-sectional view along a line 6B—6B' in FIG. 6C.

On a non-nucleation surface 402 of the substrate 401, there are formed plural nucleation surfaces 404 of a substantially square shape, with a lateral length k and with a pitch l, and selective crystal growth thereon provides a polycrystalline silicon film consisting of silicon single crystals 403 of large grain sizes, with checkerboard-like grain boundaries 405. Such checkerboard-like grain boundaries can be obtained because the positions of generation of nuclei, or of single crystals, and the grain sizes during the growth of single crystals are controlled.

For the purpose of avoiding formation of such grain boundaries, the U.S. Pat. No. 5,094,697 of the present applicant discloses a polycrystalline solar cell consisting of a group of single crystals of satisfactory characteristics without grain boundaries. More specifically, said patent application discloses a photovoltaic element comprising first photovoltaic elements including a plurality of mutually non-contacting semiconductive single crystals formed by a crystal growing process on a substrate having a non-nucleation surface and a plurality of nucleation surfaces which have a nucleation density sufficiently higher than that of said non-nucleation surface and each of which has a surface area sufficiently small for allowing formation of only one nucleus for growing a single crystal, and a second photovoltaic element formed on said substrate so as to cover all of said first photovoltaic elements.

FIG. 8 illustrates, for the purpose of comparison, a solar cell disclosed in the above-mentioned patent of the present applicant, wherein there are shown a stainless steel substrate 1; apertures 2; a $SiO_2$ layer 3; single crystals 4, 5 respectively of $P^+$ and P types formed by selective crystal growth; an $N^+$-polycrystalline layer 6; an amorphous P-Si layer 7; an amorphous I-Si layer 8; an amorphous N-Si layer 9; and a transparent electrode 10. The illustrated configuration enables a significant increase in the open-circuit voltage, since the single crystals are mutually separated and do not form grain boundaries.

However, such separated configuration significantly increases the surface area of the crystals in comparison with a continuous film of mutually contacting single crystals, and it has been found that an increase in the junction area or in the contact area between the semiconductor layer and the transparent electrode increases the amount of recombination at the interface, thus resulting in a reduction in the open-circuit voltage. The present invention is to provide an improvement for overcoming the drawbacks in such conventional configuration.

SUMMARY OF THE INVENTION

According to the present invention, the above-mentioned drawbacks resulting from the recombination at the interface boundaries are resolved by effecting the selective crystal growth, terminating said growth immediately before, or even before, the formation of grain boundaries by mutual contact of neighboring single crystals in said growth, then forming a thin insulating film on the surface of the crystals, then partly removing said insulating film and forming a junction in the thus removed area of the insulating film, whereby the influence of recombination at the interface is suppressed.

An object of the present invention is to provide a crystalline solar cell with a high open-circuit voltage and without grain boundaries, attained by the control of the grain boundaries of single crystals grown by nuclei generation, and a production method therefor.

Another object of the present invention is to provide an inexpensive crystalline solar cell formed by growth of a layer of silicon single crystals of large grain sizes on a substrate, and a production method therefor.

Still another object of the present invention is to provide a crystalline solar cell capable of reducing the influence of interface recombination, thereby providing a higher open-circuit voltage and attaining a higher energy conversion efficiency, and a production method therefor.

The crystalline solar cell of the present invention is characterized by the nucleation surfaces being regularly arranged in a non-nucleation surface, wherein the single crystals grown on said nucleation surface do not form crystal grain boundaries, the surfaces of said single crystals are covered by a thin insulation film layer, and said insulation film is partly opened to form a junction surface.

Also, the method of the present invention for producing the crystalline solar cell is characterized by a step of forming small nucleation surfaces in a regular arrangement on a non-nucleation surface on a substrate, a step of generating and growing single crystals only on the nucleation surfaces on the substrate by selective crystal growth, a step of terminating the single crystals before the formation of crystal grain boundaries by mutual contact of the neighboring single crystals in said growth, a step of forming a semiconductive junction by forming a thin insulation film layer on the surface of the single crystals and partly removing said insulation film, and a step of forming a transparent conductive layer and a current-collecting electrode on the surface of the single crystals.

DETAILED DESCRIPTION OF THE PREFERRED EMBODIMENTS

In the following there will be explained the experimental history that has lead to the present invention.

Figure 6A:
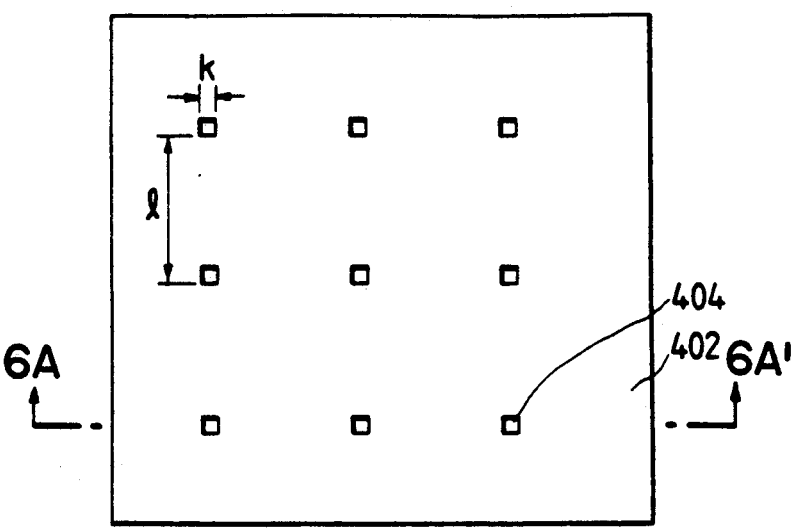
FIGS. 6A to 6D provide views of experiments conducted for reaching the present invention, wherein 6A is a plan view of a regular arrangement of nucleation surfaces on a substrate, 6B is a lateral cross-sectional view along a line 6A—6A' in 6A, 6C is a plan view of single crystals grown to a level of forming grain boundaries from said nucleation surfaces, and 6D is a lateral cross-sectional view along a line 6B—6B' in 6C.
Figure 6B:
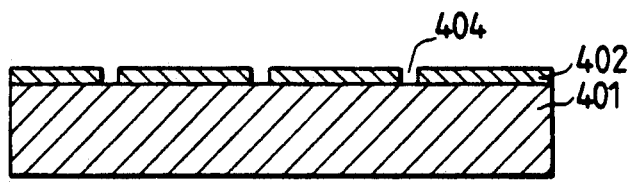

On a Mo substrate of a thickness of 500 μm, Si was deposited by evaporation with a thickness of about 300 Å and heat treated for 30 minutes at 600° C. to form a silicide layer. On said layer, an insulating $SiO_2$ layer was formed with a thickness of 1000 Å in an atmospheric pressure CVD apparatus, and was photolithographically etched to form square apertures with a side k=1.2 μm, arranged with a grid pattern of a pitch l=30 μm, as shown in FIGS. 6A and 6B. The $SiO_2$ layer constitutes the non-nucleation surface, while the silicide layer exposed in the square apertures constitutes the nucleation surfaces. The shape of the apertures is not limitative and may be rectangular, circular etc., as long as nucleation is possible. Also, the pitch of the apertures may be selected in various manners as long as the crystals grown therefrom do not mutually contact, but said apertures are preferably arranged in a regular manner for facilitating the control of crystal growth.

Then selective crystal growth was conducted in a low pressure CVD (LPCVD) apparatus, employing $SiH_2Cl_2$ as the raw material gas and $H_2$ as the carrier gas, with the addition of HCl for suppressing nucleation on the $SiO^2$ insulation layer, under the growing conditions shown in Table 1;

TABLE 1

| Gas flow rate (l/min.) | Substrate temp (°C.) | Pressure (Torr) | Growing time (min.) |
| --- | --- | --- | --- |
| $SiH_2Cl_2$/HCl/$H_2$ = 0.53/1.6/100 | 950 | 100 | 150 |

Figure 6C:
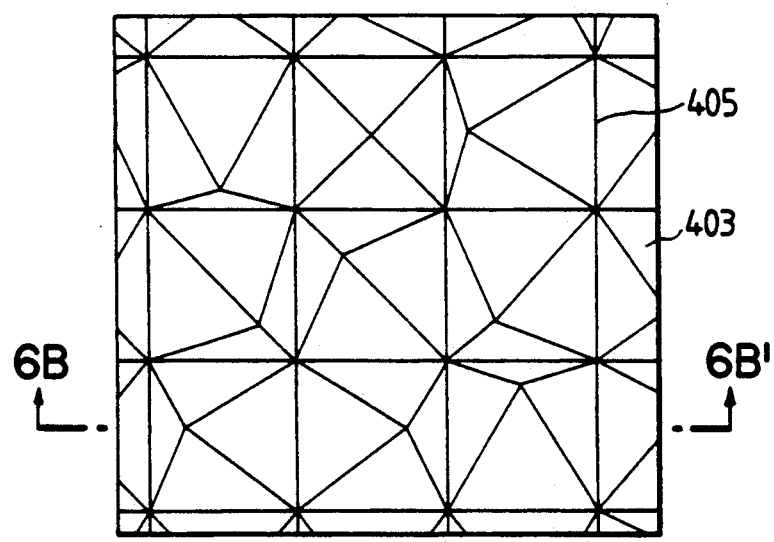
Figure 6D:
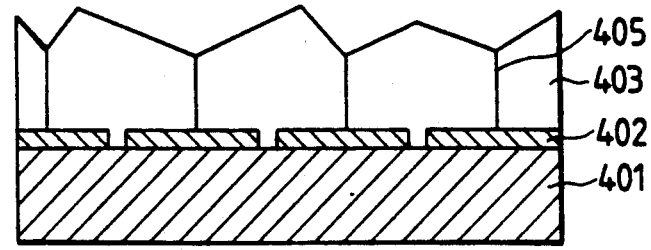
Figure 7A:
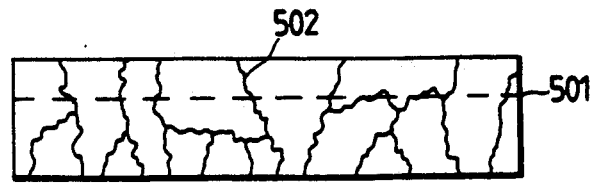
FIGS. 7A and 7B illustrate conventional semiconductor layers in schematic cross-sectional views, wherein 7A shows a polycrystalline semiconductor layer, and 7B shows a semiconductor layer consisting of a group of single crystals.
Figure 7B:
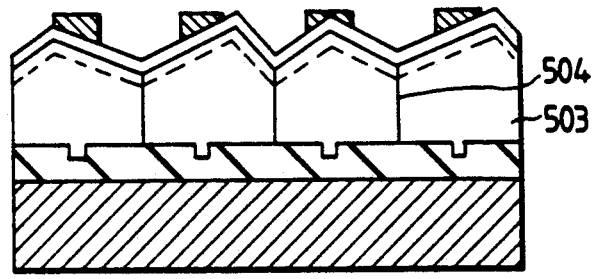
Figure 8:
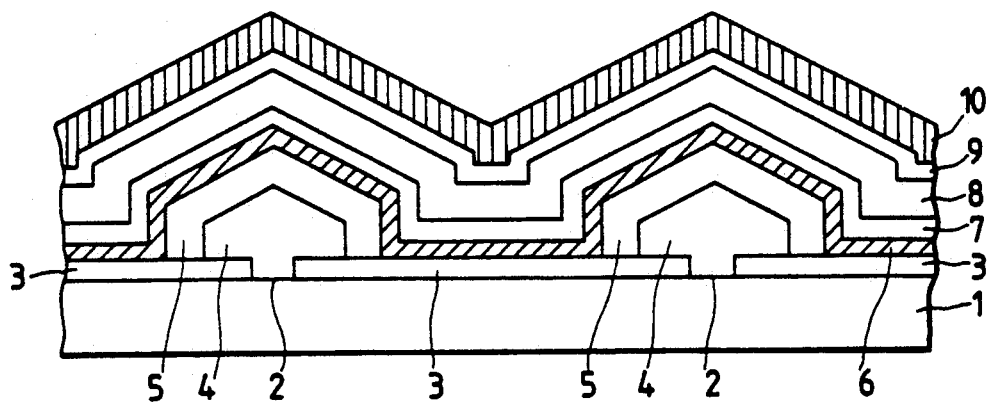
FIG. 8 is a lateral cross-sectional view of a semiconductor layer, illustrated for the purpose of comparison.

The growth was terminated after 150 minutes, and the observation of the substrate surface under an optical microscope showed a regular arrangement of single crystals, with peaked facets as shown in FIGS. 6C and 6D, in grid patterns with a pitch of 30 μm, confirming that the selective crystal growth was achieved according to the above-mentioned pattern of apertures. Also the positions of the grain boundaries were defined in a grating pattern.

Then, when the selective crystal growth was conducted under the same conditions as in Table 1 except that the growing time was reduced to 80 minutes, the single crystals grew to an extent that said crystals were only partly in mutual contact.

When the growing time was further reduced to 70 minutes, there was obtained a state in which all the single crystals were not in mutual contact, thus being free from formation of grain boundaries.

Figure 5A:
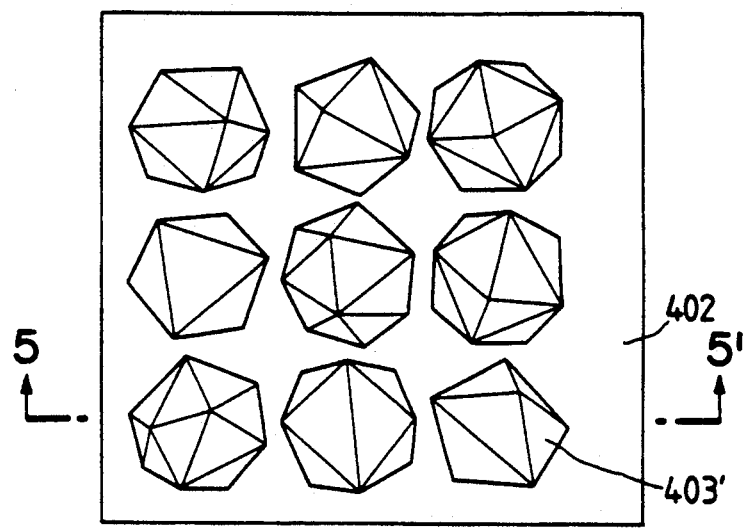
FIG. 5A is a plan view of the solar cell of the present invention, specifically showing the absence of grain boundaries.
Figure 5B:
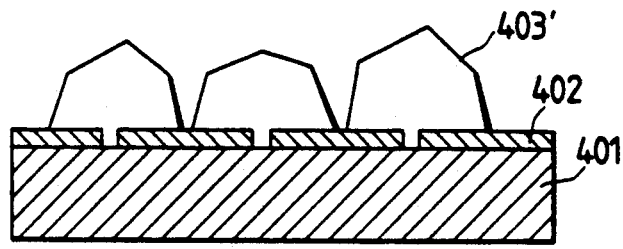
FIG. 5B is a lateral cross-sectional view along a line 5—5' in FIG. 5A.

In this manner there was obtained a Si layer 403' consisting of single crystals without grain boundaries, as shown in a plan view in FIG. 5A and in a cross-sectional view in FIG. 5B.

Then a thin silicon film consisting of single crystals was grown by LPCVD, employing a substrate including nucleation surfaces consisting of a silicide layer and a non-nucleation surface consisting of $SiO_2$, under the conditions shown in Table 2:

TABLE 2

| Gas flow rate (l/min.) | Substrate temp (°C.) | Pressure (Torr) | Growing time (min.) |
| --- | --- | --- | --- |
| $SiH_2Cl_2$/HCl/$H_2$ = | | | |
| 0.53/2.0/100* | 950 | 100 | 10 |
| 0.53/1.6/100 | 950 | 100 | 60 |

*$PH_3$ added: $PH_3/SiH_2Cl_2 = 3 \times 10^{-4}$

The obtained silicon layer, consisting of a group of single crystals, was subjected to implantation of $B^+$ ions with a concentration of $1 \times 10^{15}$ cm$^{-2}$ under an energy of 20 KeV, and was annealed for 1 hour at 550° C., then for 30 minutes at 800° C., and finally for 1 hour at 550° C. to effect activation of the impurities and recovery of damage caused by ion implantation, thereby forming a junction. A solar cell was prepared by vacuum evaporation of a transparent conductive film and a current-collecting electrode on the surface of the crystals. For the purpose of comparison, an identical substrate was processed in the same manner except that the second growing time in Table 2 was extended from 60 minutes to 140 minutes to for a polycrystalline silicon film having grain boundaries. A solar cell was prepared by forming a junction in the same manner as explained above, and then forming a transparent conductive film and a current-collecting electrode by vacuum evaporation.

In the measurement of voltage-current characteristics, the solar cell utilizing a group of single crystals without grain boundaries showed an inverse saturated current (dark current) of $10^{-9}$ A/cm$^2$ or lower, while the polycrystalline silicon solar cell having grain boundaries showed a dark current of $10^{-5}$ A/cm$^2$. Thus, the elimination of grain boundaries reduced the dark current by at least 4 orders of magnitude, in comparison with the case involving the grain boundaries.

Then measurements were conducted of the current-voltage I-V) characteristics under irradiation with AM1.5 light (100 mW/cm$^2$). The solar cell utilizing the single crystals without grain boundaries and with a cell area of 0.36 cm$^2$ showed an open-circuit voltage of 0.55 V, a short circuit current of 22 mA/cm$^2$, a fill factor of 0.72, and a conversion efficiency of 8.7%. On the other hand, the polycrystalline silicon solar cell having grain boundaries and with a cell area of 0.36 cm$^2$ showed an open-circuit voltage of 0.36 V, a short-circuit current of 25 mA/cm$^2$, a fill factor of 0.62, and a conversion efficiency of 5.6%. Thus the configuration without grain boundaries significantly improved the open-circuit voltage.

In comparison with the polycrystalline silicon solar cell having grain boundaries, the solar cell based on the single crystals without grain boundaries did not show a significant change in the short circuit current, despite the smaller volume of the entire crystals. This is because the configuration without grain boundaries has a larger surface area for the light entry, and effects efficient light absorption by scattering, as the crystal surfaces are more frequently at sharp angles to the substrate surface.

Then, with a substrate including nucleation surfaces composed of a silicide layer and a non-nucleation surface composed of $SiO_2$, there was grown a thin silicon film consisting of single crystals by LPCVD under the conditions shown in Table 2. On the surface of the thus formed silicon layer consisting of a group of peaked single crystals, an insulating $SiO_2$ layer was formed with a thickness of 100 Å, and photoresist with adjusted viscosity was coated thereon, so as to expose the peak portions of said peaked single crystals. The exposed $SiO_2$ layer was etched off with aqueous HF solution, and $B^+$ ions were implanted with an energy of 20 KeV and a concentration of $1 \times 10^{15}$ cm$^{-2}$ into the exposed crystalline silicon layer, while the photoresist was still present. After removal of the photoresist, annealing was conducted for 1 hour at 550° C., then for 30 minutes at 800° C., and finally for 1 hour at 550° C. in a continuous manner, thereby effecting activation of the impurities and recovery of damage caused by the ion implantation, and forming a junction. Finally, the solar cell was completed by forming a transparent conductive film and a current-collecting electrode on the crystalline surface.

The thus obtained solar cell, based on a group of single crystals without grain boundaries and having an insulation film covering the crystal surface, showed a dark current which was about one order of magnitude lower than that in the configuration without the insulating layer.

Also, in the measurement of I-V characteristics under irradiation with AM1.5 light, said solar cell with a cell area of 0.36 cm$^2$ showed an open circuit voltage of 0.57 V, a short circuit current of 24 mA/cm$^2$, a fill factor of 0.71, and a conversion efficiency of 9.7%.

As explained in the foregoing, by covering the surfaces of polycrystals consisting of a group of single crystals without grain boundaries with an insulation layer and forming a junction by forming an opening in a part of said insulation layer, the dark current component resulting from recombinations at the interface can be reduced, and there can be obtained a solar cell of satisfactory characteristics with a high open-circuit voltage.

In the following there will be explained embodiments of the present invention.

Figure 1:
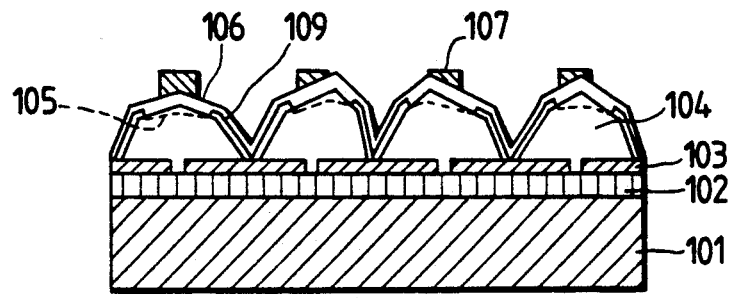
FIG. 1 is a schematic cross-sectional view of a solar cell of the present invention.

FIG. 1 is a schematic view of a solar cell constituting an embodiment of the present invention.

On a metal substrate 101, there are laminated, in succession, a thin silicide layer 102, an insulation layer 103 composed, for example, of $SiO_2$ and constituting a non-nucleation surface, and a Si layer 104 consisting of single crystals which do not have grain boundaries with the neighboring ones. On said Si layer 104 there are formed an insulation layer 109, and a monocrystalline semiconductor layer 105 forming a semiconductor junction, and further provided thereon are a transparent conductive film 106 serving also as an anti-reflection film, and a current-collecting electrode 107.

The metal substrate 101 can be composed of any metal with satisfactory conductivity capable of reacting with silicon to form a compound such as a silicide, and examples of such metal include W, Mo, and Cr. Naturally, there may be employed any other substrate bearing thereon a metal of the above-mentioned property. Thus an inexpensive non-metal substrate can be used, with a metal layer deposited thereon, for example, by sputtering. The thickness of the silicide layer 102 is not critical, but is desirably in a range of 0.01 to 0.1 μm. The thickness of the insulation layer 103 is not critical, but is suitably within a range of 0.02 to 1 μm. The grain size of the single crystals in the Si layer 104 is generally in a range of 10 to 500 μm, preferably 20 to 500 μm, in consideration of the solar cell performance and the process limitations. The thickness of the semiconductor layer 105 is generally in a range of 0.05 to 3 μm, preferably 0.1 to 1 μm, though it is dependent on the amount of introduced impurity. The insulation layer 109 is preferably composed of $SiO_2$, or $Si_3N_4$ with stable interface characteristics, and the thickness thereof is generally selected within a range of 50 to 200 Å for the purpose of suppression of surface reflection.

In the following there will be explained the method for producing the solar cell of the present embodiment.

Figure 3A:
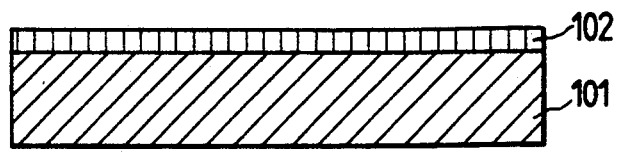
FIGS. 3A to 3E are views showing steps of producing an embodiment of the solar cell of the present invention.
Figure 3B:
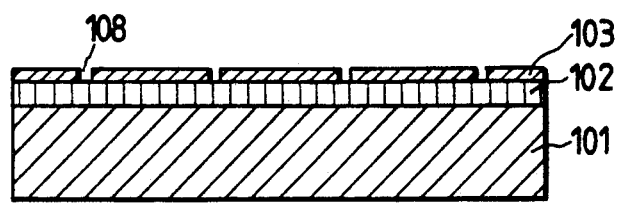
Figure 3C:
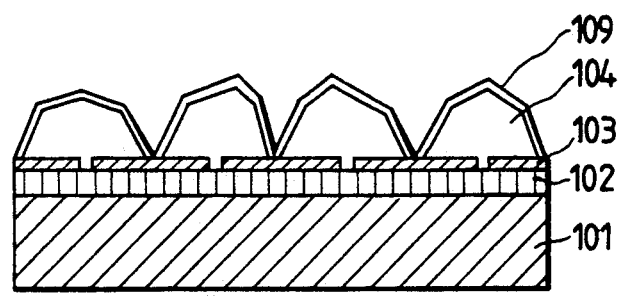
Figure 3D:
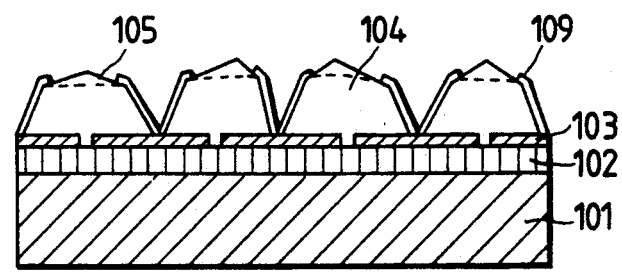

FIGS. 3A to 3E illustrate steps of the method for producing the solar cell of the present invention. On a metal substrate 101, a silicon layer is deposited by vacuum evaporation or by LPCVD, and is annealed to obtain a silicide layer 102 (FIG. 3A). On said silicide layer 102, there is formed an insulation layer 103 (an oxide film obtained by thermal oxidation or atmospheric pressure CVD), which is photolithographically etched to form regularly arranged small apertures 108 exposing the silicide layer as the nucleation surfaces (FIG. 3B). Crystals are grown from the small apertures 108 by selective crystal growth and lateral crystal growth, thereby forming a Si layer 104 consisting of single crystals. The crystal growth is so conducted that the neighboring silicon single crystals do not mutually contact at the end of the growth. Also, doping may be employed at the initial period of crystal growth for introducing atoms of an impurity (for example phosphorus in the case of N-type) at a high concentration, thereby attaining an ohmic contact with the silicide layer 102. On the thus obtained monocrystalline silicon layer 104, there is formed a thin insulation layer 109, such as an oxide film formed by thermal oxidation (FIG. 3C). Photoresist with adjusted viscosity is coated thereon to expose the peak portions of the peaked single crystals, then the insulation layer is removed in the thus exposed portions, and the photoresist is then stripped.

Figure 2:
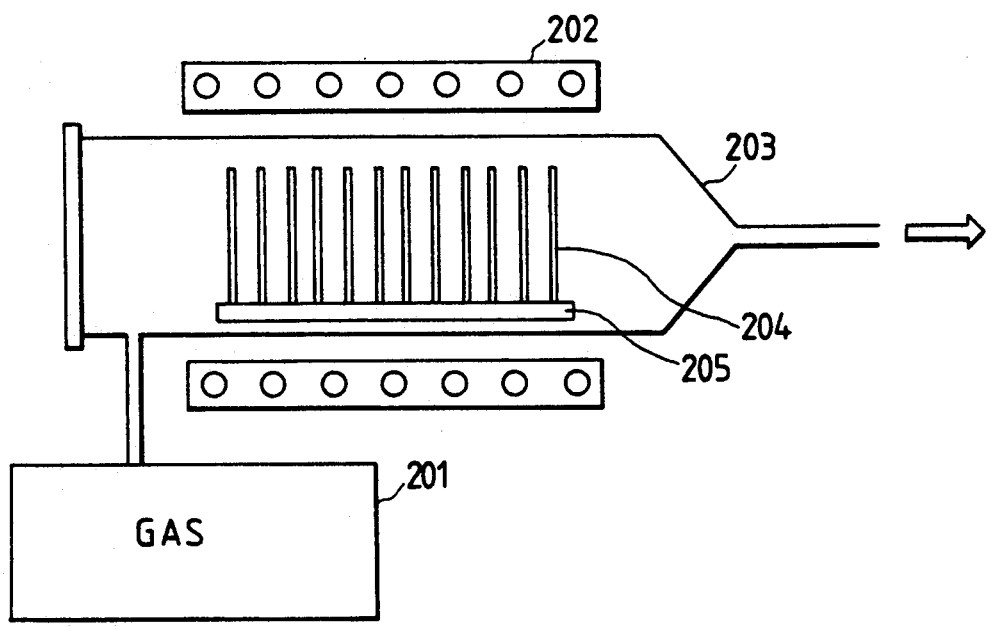
FIG. 2 is a schematic view of an LPCVD apparatus.
Figure 3E:
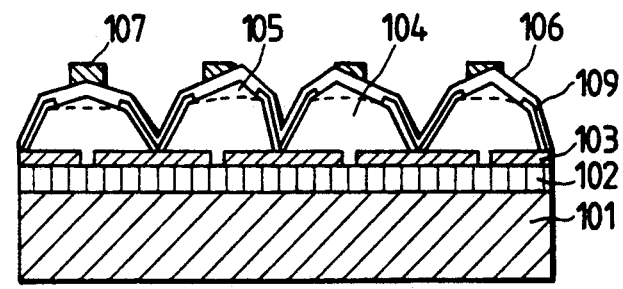

Subsequently a $P^+$ (or $N^+$) semiconductor layer 105 is formed by impurity diffusion or ion implantation on the crystal surface (FIG. 3D), and a transparent conductive film 106 and a current-collecting electrode 107 are formed (FIG. 3E). The insulation layer 103 constituting the non-nucleation surface is composed of a material of a considerably smaller nucleation density, such as $SiO_2$ or $Si_3N_4$, in comparison with that of silicon, for the purpose of suppressing nucleation during the crystal growth. There may also be employed metal oxides or other oxides. The shape of the apertures 108 formed on the non-nucleation surface is not critical and may be arbitrarily selected. In the case where said apertures 108 are square, the lateral length thereof is selected within a range of 1 to 4 μm. The arrangement of the apertures 108 is not critical, but representative examples thereof include a grid pattern arrangement or a honeycomb pattern arrangement which achieves closest packing of the single crystals in the grown Si layer 104. The pitch of the apertures is suitably selected according to the size of the silicon single crystals to be grown, but is generally in a range of l=10–500 μm. The selective crystal growth is achieved by thermal CVD including LPCVD, plasma CVD, photo CVD, liquid phase growth etc., but is generally conducted by LPCVD. FIG. 2 is a schematic view of an LPCVD apparatus, principally composed of a gas supply unit 201, a heater 202, a quartz reactor tube 203, a substrate 204, a susceptor 205 etc. Examples of the raw material gas for selective crystal growth includes silanes and halogenated silanes such as $SiH_2Cl_2$, $SiCl_4$, $SiHCl_3$, $SiH_4$, $Si_2H_6$, $SiH_2F_2$, and $Si_2F_6$. $H_2$ is added as a carrier gas, or for obtaining a reductive atmosphere for accelerating the crystal growth. The ratio of the raw material gas to hydrogen gas is suitably determined according to the single crystal forming method, species of the raw material gas, material of the insulation layer and film forming conditions, but is preferably within a range from 1:10 to 1:1000 in the flow rates, and more preferably from 1:20 to 1:800. The ratio of HCl, added to the raw material gas for the purpose of preventing nucleation on the insulation layer, is suitably determined according to the film forming method, species of the raw material gas, material of the insulation layer and film forming conditions, but is generally within a range from 1:0.1 to 1:100, preferably from 1:0.2 to 1:80. The temperature and pressure of selective crystal growth are determined according to the single crystal forming method, species of the raw material gas, and film forming conditions such as the flow rate ratio of the raw material gas, $H_2$, and HCl.

However, the temperature in the ordinary LPCVD is generally within a range from 600° to 1250° C., preferably from 650° to 1200° C.

In another method, the solar cell of the present invention may also be prepared by liquid phase crystal growth in which a substrate is maintained in contact with a solvent for growing crystals.

The temperature in this case is determined according to the solvent to be employed, but, in case Sn is employed, the temperature is desirably controlled within a range from 850° to 1050° C. Also, the temperature in a low-temperature process such as plasma CVD is generally selected within a range from 200° to 600° C., preferably 200° to 500° C. The pressure is generally selected within a range from $10^{-2}$ to 760 Torr, preferably from $10^{-1}$ to 760 Torr. The junction may be formed by impurity diffusion or ion implantation after the growth of single crystals. It may also be formed by doping in the course of growth of single crystals. There may also be employed a heterogeneous junction with a semiconductor other than monocrystalline silicon, such as amorphous Si, amorphous SiGe, microcrystalline Si, or microcrystalline SiC. Examples of impurity atoms used for forming the junction include P, As, and Sb for N-type, and B, Al, In, and Ga for P-type.

EXAMPLE 1

On a Mo substrate 101 of a thickness of 0.9 mm, a silicon layer of a thickness of 500 Å was deposited, in a LPCVD apparatus as shown in FIG. 2, by thermal decomposition of $SiH_4$ at 630° C., and was maintained at said temperature for 30 minutes to obtain a silicide layer 102.

On said silicide layer 102, there was deposited a $Si_3N_4$ layer as the insulation layer 103 of a thickness of 1000 Å in a LPCVD apparatus as shown in FIG. 2, and said layer was dry etched to form square apertures with a lateral length k=1 μm in a grid pattern with a pitch l=50 μm, thereby forming a non-nucleation surface ($Si_3N_4$) and nucleation surfaces (silicide).

Then selective crystal growth was conducted, with a LPCVD apparatus as shown in FIG. 2, under the conditions shown in Table 3 to obtain a Si layer 104 consisting of single crystals. The grain size and film thickness of the thus obtained silicon layer were, respectively, about 45 μm and about 22 μm.

TABLE 3

| Gas flow rate (l/min.) | Substrate temp (°C.) | Pressure (Torr) | Growing time (min.) |
|---|---|---|---|
| $SiH_2Cl_2$/HCl/$H_2$ = | | | |
| 0.53/2.0/100* | 950 | 100 | 10 |
| 0.53/1.6/100 | 950 | 100 | 180 |

*$PH_3$ addition: $PH_3$/$SiH_2Cl_2$ = 3 × $10^{-4}$

On the thus obtained monocrystalline silicon layer 104, a $SiO_2$ layer of a thickness of 150 Å was formed by thermal oxidation, and photoresist with adjusted viscosity was coated thereon to expose the peak portions of the peaked single crystals. In order to expose the peaks and surrounding portions only, it was necessary to adjust the viscosity of photoresist, according to the surface irregularities (related to the dimension l) of the peaked singled crystals. In this case, there was employed photoresist with a viscosity of 35 cp. After exposed $SiO_2$ was etched off with aqueous HF solution, the photoresist was stripped. Then B ions were implanted with an energy of 20 KeV and a concentration or $1 \times 10^{15}$ cm$^{-2}$ into the exposed surface of the single crystals, and annealing was conducted for 1 hour at 550° C., then for 30 minutes at 800° C., and finally for 1 hour at 550° C. in a continuous manner to obtain a p$^+$semiconductor layer 105. Finally, on said semiconductor layer 105, there were formed, by electron beam evaporation, a transparent conductive ITO film 106 of a thickness of 820 Å and a current-collecting electrode 107 of Cr (200 Å)/Ag (1 μm)/Cr (400 Å).

In a measurement of the I-V characteristics under irradiation with AM 1.5 light (100 mW/cm$^2$), the crystalline silicon solar cell obtained in this manner with a cell area of 0.36 cm$^2$ showed an open-circuit voltage of 0.58 V, a short-circuit current of 27 mA/cm$^2$, a fill factor of 0.72, and an energy conversion efficiency of 11.3%. In this manner, a crystalline solar cell of satisfactory characteristics could be obtained from a non-monocrystalline substrate.

EXAMPLE 2

A p$^+$n$^-$n$^+$crystalline solar cell was prepared in a similar manner to example 1. On a Mo substrate silicon was deposited as explained before to form a silicide layer 102. On said layer, a $SiO_2$ insulation layer 103 was deposited with a thickness of 1000 Å in an ordinary CVD apparatus and was photolithographically patterned to form apertures with a lateral size k=1.2 μm and a pitch l=50 μm in the $SiO_2$ layer. Then selective crystal growth was conducted in a LPCVD apparatus as shown in FIG. 2 under the conditions shown in Table 4, thereby obtaining a Si layer 104 consisting of single crystals:

TABLE 4

| Gas flow rate (l/min.) | Substrate temp (°C.) | Pressure (Torr) | Growing time (min.) |
|---|---|---|---|
| $SiH_2Cl_2/HCl/H_2 =$ | | | |
| 0.53/2.0/100* | 950 | 100 | 10 |
| 0.53/1.6/100** | 950 | 100 | 180 |

*$PH_3$ addition: $PH_3/SiH_2Cl_2 = 3 \times 10^{-4}$
**$PH_3$ addition: $PH_3/SiH_2Cl_2 = 2 \times 10^{-6}$ In the course of selective crystal growth under the conditions of Table 4, doping was conducted by mixing a small amount of impurity, which consisted of $PH_3$ in a ratio, to the raw material gas of $PH_3SiH_2Cl_2 = 2 \times 10^{-6}$. The grain size and film thickness of the obtained silicon single crystals were respectively about 45 μm and about 22 μm. On the thus formed silicon layer consisting of the group of peaked single crystals, a $SiO_2$ layer of a thickness of 100 Å was formed by thermal oxidation, and photoresist with adjusted viscosity was coated thereon to expose the peak portions of said peaked single crystals. After the thus exposed $SiO_2$ layer was etched off with aqueous HF solution, Al and Si were deposited by vacuum evaporation, with respective thickness of 600 Å, on the polycrystalline silicon, for forming a p+ semiconductor layer 105 while the photoresist still remained. Thereafter the photoresist was stripped, by the lift-off process, to leave the Al/Si layer on the peak portions of the peaked single crystals.

The RTA (rapid thermal annealing) was applied for 15 seconds at 800° C. to form the p+ semiconductor layer 105. After processing with phosphoric acid, a transparent conductive ITO film 106, serving also as an antireflective film, was formed by electron beam evaporation with a thickness of ca. 900 Å, and a current-collecting Cr electrode 107 was formed thereon by vacuum evaporation, with a thickness of 1 μm.

The measurement of the I-V characteristics under irradiation with AM1.5 light provided, for a cell area of 0.16 cm², an open-circuit voltage of 0.57 V, a short circuit current of 28 mA/cm², a fill factor of 0.71, and an energy conversion efficiency as high as 11.3%.

EXAMPLE 3

Figure 4A:
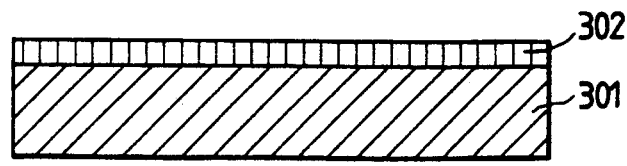
FIGS. 4A to 4E are views showing steps producing another embodiment of the solar cell of the present invention.
Figure 4B:
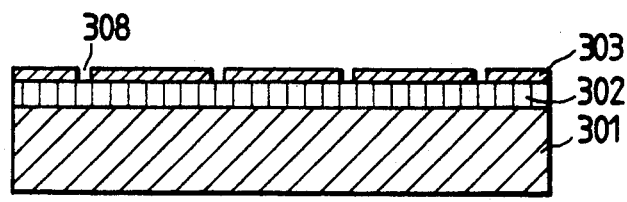

In the following there will be described a solar cell employing a p+μc-Si layer in the semiconductor layer, and the steps of preparation of such solar cell are illustrated in FIGS. 4A through 4E. Said solar cell was prepared in the following manner: On a Cr substrate 301, a silicon layer was deposited with a thickness of 400 Å by plasma CVD, through the decomposition of $SiH_4$, and was annealed for 30 minutes at 500° C. to obtain a silicide layer 302 (FIG. 4A). On said silicide layer 302, a $SiO_2$ film of a thickness of 800 Å was deposited by atmospheric pressure CVD, and apertures 308 were formed with a lateral side k=1.2 μm and a pitch l=50 μm (FIG. 4B). Then selective crystal growth was conducted by LPCVD under the conditions shown in Table 5 to obtain a Si layer 304 consisting of single crystals. The grain size and the film thickness of silicon single crystals after growth were respectively ca. 45 μm and ca. 22 μm.

Figure 4C:
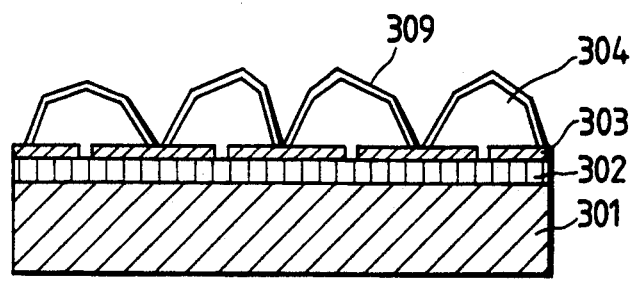

The surface of the thus obtained monocrystalline silicon layer 304 was subjected to RTO (rapid thermal oxidation) for 30 seconds at 1150° C. in an oxygen atmosphere to form a $SiO_2$ layer with a thickness of 110 Å (FIG. 4C). Then photoresist with adjusted viscosity was coated thereon, exposing the peak portions of the peaked single crystals. After the exposed $SiO_2$ layer was etched off with aqueous HF solution, the photoresist was stripped.

Figure 4D:
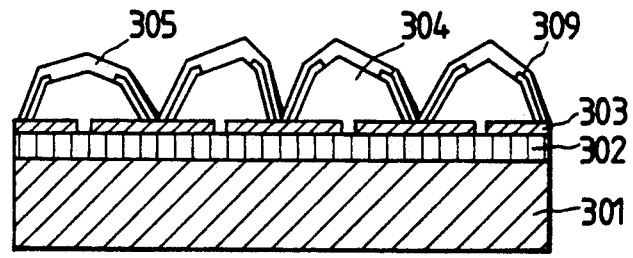
Figure 4E:
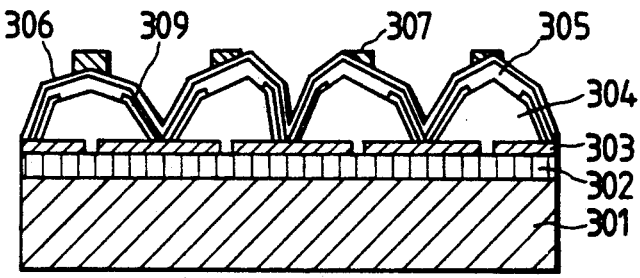

On the thus obtained peaked silicon crystals, there was deposited a p+μc-Si layer 305 of a thickness of 200 Å with an ordinary plasma CVD apparatus, under the conditions shown in Table 5. In this state, the dark conductivity of the μc-Si film was about $10^1$ s.cm$^{-1}$ (FIG. 4D).

TABLE 5

| Gas flow rate | Substrate temp (°C.) | Pressure (Torr) | Growing time (min.) |
|---|---|---|---|
| $SiH_4/H_2 =$ 1 cc/20 cc $B_2H_6/SiH_4 =$ $2.0 \times 10^{-3}$ | 250 | 0.5 | 20 W |

Absence of grain boundaries was confirmed even after the formation of the heterogeneous PN junction.

After the formation of the heterogeneous PN junction as explained above, a transparent conductive ITO film 306 was formed with a thickness of about 850 Å by electron beam evaporation. The p+ μc-Si/crystalline silicon heterogeneous solar cell thus obtained showed, in the measurement of the I-V characteristics under irradiation with AM1.5 light (cell area 0.36 cm²), an open-circuit voltage of 0.60 V, a short circuit current of 30.2 mA/cm², a fill factor of 0.65, and an energy conversion efficiency as high as 11.8%.

As explained above, the open-circuit voltage can be further increased by the use of a heterogeneous junction.

EXAMPLE 4

An n+p−p+ crystalline solar cell was prepared in a similar manner to example 2. On a Cr substrate 101, a silicon layer of a thickness of 500 Å was deposited by thermal decomposition of $SiH_4$ at 630° C. in a LPCVD apparatus shown in FIG. 2, and was maintained at the same temperature for 30 minutes to form a silicide layer 102. On said layer there was deposited a $SiO_2$ layer of a thickness of 800 Å in an ordinary pressure CVD apparatus. In said $SiO_2$ layer, there were formed apertures with k=1.2 μm and l=50 μm in a periodic manner, and selective crystal growth was conducted in a LPCVD apparatus under the conditions shown in Table 6 to obtain a Si layer 104 consisting of single crystals.

TABLE 6

| Gas flow rate (l/min.) | Substrate temp (°C.) | Pressure (Torr) | Growing time (min.) |
|---|---|---|---|
| $SiH_2Cl_2/HCl/H_2 =$ | | | |
| 0.53/2.0/100* | 950 | 100 | 10 |
| 0.53/1.6/100** | 950 | 100 | 190 |

*$B_2H_6$ addition: $B_2H_6/SiH_2Cl_2 = 4 \times 10^{-4}$
**$B_2H_6$ addition: $B_2H_6/SiH_2Cl_2 = 1 \times 10^{-6}$ In the course of selective crystal growth, B was doped in two stages according to the conditions shown in Table 6, with the amounts of introduction of $B_2H_6/SiH^2Cl^2 = 4 \times 10^{-4}$ and $1 \times 10^{-6}$. The grain size and the film thickness of the silicon single crystals after growth were respectively about 47 μm and about 23 μm. On the crystalline silicon layer, consisting of a group of peaked single crystals, a $Si_3N_4$ layer of a thickness of 100 Å was deposited by a LPCVD apparatus, and photoresist with an adjusted viscosity was coated thereon, thus exposing the peak portions of said peaked single crystals. The exposed $Si_3N_4$ layer was removed by dry etching, and the photoresist was then stripped. PSG (phosphosilicate glass) was deposited thereon by an atmospheric pressure CVD apparatus, and was utilized as a diffusion source to effect thermal diffusion of phosphorus at 950° C., thereby forming an n+-semiconductor layer 105.

It was confirmed that grain boundaries were absent after the formation of the PN junction.

The PSG was then etched off with aqueous HF solution, and finally a transparent conductive ITO film 106 of a thickness of 800 Å and a current-collecting Cr electrode 107 of a thickness of 1 μm were prepared to complete the solar cell.

In the measurement of the I-V characteristics under irradiation with AM1.5 light, the n+p−p+solar cell thus prepared with a cell area of 0.16 cm$^2$ shows an open-circuit voltage of 0.6 V, a short circuit current of 26 mA/cm$^2$, a fill( factor of 0.76, and an energy conversion efficiency as high as 11.9%. Also the dark current was about one order of magnitude lower, in comparison with the case in which the crystal layer surface was not covered with $Si_3N_4$.

What is claimed is:

1. A crystalline solar cell formed by growing single crystals of one conductivity type on respective plural nucleation areas provided on a non-nucleation surface of a substrate in such a manner that the neighboring single crystals do not have a crystal grain boundary therebetween, wherein:
   an insulation layer having an aperture is formed on each of said single crystals; and
   a semiconductor junction is formed with each single crystal at the respective aperature.

2. A crystalline solar cell according to claim 1, wherein said nucleation areas are arranged in a regular manner in said non-nucleation surface.

3. A crystalline solar cell according to claim 1, wherein facets of said single crystals stand at sharp angles to said substrate.

4. A crystalline solar cell according to claim 1, wherein said insulation layer is composed of $SiO_2$ or $Si_3N_4$.

5. A crystalline solar cell according to claim 1, wherein said insulation layer has a thickness in the range of 50 to 200 Å.

6. A crystalline solar cell according claim 1, wherein the dopant impurity used for forming said semiconductor junction is P, As, Sb, B, Al, In, or Ga.

7. A crystalline solar cell according to claim 1, wherein said semiconductor junction is formed at the surface of said single crystals.

8. A crystalline solar cell according to claim 1, wherein a semiconductor layer constituting said semiconductor junction has a thickness in the range of 0.05 to 3 μm.

9. A crystalline solar cell according to claim 1, wherein said single crystals have a grain size in the range of 10 to 500 μm.

10. A method for producing a crystalline solar cell, comprising steps of:
    forming a plurality of spaced apart nucleation areas in a non-nucleation surface on a substrate;
    generating and growing semiconductor single crystals of one conductivity type on said nucleation areas by selective crystal growth;
    terminating the growth of said single crystals before the formation of crystal grain boundaries by mutual contact of the neighboring single crystals;
    forming an insulation layer on the surface of said single crystals;
    forming an aperature in said insulation layer at each said single crystal and then forming a semiconductor junction with each single crystal at each said aperture; and
    successively forming a transparent conductive layer and a current-collecting electrode in said aperatures.

11. A method for producing a crystalline solar cell according to claim 10, wherein said step of forming the nucleation areas in the non-nucleation surface comprises forming said nucleation areas in a regular arrangement.

12. A method for producing a crystalline solar cell according to claim 10, wherein said step of growing the semiconductor single crystals comprises forming the single crystals standing at sharp angles to the substrate.

13. A method for producing a crystalline solar cell according to claim 10, wherein said insulation layer is composed of $SiO_2$ or $Si_3N_4$.

14. A method for producing a crystalline solar cell according to claim 10, wherein said insulation layer has a thickness in the range of 50 to 200 Å.

15. A method for producing a crystalline solar cell according to claim 10, wherein said step of forming the semiconductor junction is performed by thermal diffusion or ion implantation of an impurity, or by heterogeneous junction formation.

16. A method for producing a crystalline solar cell according to claim 15, wherein the impurity employed for forming said semiconductor junction is P, As, Sb, B, Al, In, or Ga.

17. A method for producing a crystalline solar cell according to claim 10, wherein said step of forming the semiconductor junctions comprises forming the semiconductor junction at the surface of said single crystals.

18. A method for producing a crystalline solar cell according to claim 10, wherein a semiconductor layer constituting said semiconductor junction has a thickness within the range of 0.05 to 3 μm.

19. A method for producing a crystalline solar cell according to claim 10, wherein said single crystals have a grain size within the range of 10 to 500 μm.

* * * * *

UNITED STATES PATENT AND TRADEMARK OFFICE
CERTIFICATE OF CORRECTION

PATENT NO. : 5,269,852
DATED : December 14, 1993
INVENTOR(S) : SHOJI NISHIDA

It is certified that error appears in the above-identified patent and that said Letters Patent is hereby corrected as shown below:

COLUMN 5

Line 49, "SiO$^2$" should read --SiO$_2$--.

COLUMN 6

Line 40, "for" should read --form--.
Line 55, "I-V)" should read --(I-V)--.

COLUMN 8

Line 16, "0.1to" should read --0.1 to--.

COLUMN 9

Line 48, "10-2" should read --10$^{-2}$--.

COLUMN 13

Line 19, "fill(factor" should read --fill factor--.
Line 35, "aperature." should read --aperture.--.

UNITED STATES PATENT AND TRADEMARK OFFICE
CERTIFICATE OF CORRECTION

PATENT NO. : 5,269,852
DATED : December 14, 1993
INVENTOR(S) : SHOJI NISHIDA

It is certified that error appears in the above-identified patent and that said Letters Patent is hereby corrected as shown below:

<u>COLUMN 14</u>

```
Line 17, "aperature" should read --aperture--.
Line 23, "aperatures." should read --apertures.--.
```

Signed and Sealed this

Fifth Day of July, 1994

Attest:

BRUCE LEHMAN

Attesting Officer

Commissioner of Patents and Trademarks